US006791028B2

(12) United States Patent
Harada

(10) Patent No.: US 6,791,028 B2
(45) Date of Patent: Sep. 14, 2004

(54) NON-REVERSIBLE CIRCUIT DEVICE HAVING LAMINATED SUBSTRATE CAPABLE OF BEING REDUCED IN SIZE

(75) Inventor: Hiroshi Harada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/286,493

(22) Filed: Nov. 1, 2002

(65) Prior Publication Data

US 2003/0085770 A1 May 8, 2003

(30) Foreign Application Priority Data

Nov. 7, 2001 (JP) ....................................... 2001-342117
Jan. 24, 2002 (JP) ....................................... 2002-015790

(51) Int. Cl.[7] .................................................. H05K 5/00
(52) U.S. Cl. ....................... 174/52.1; 333/1.1; 333/24.2
(58) Field of Search ................................ 333/1.1, 24.2; 174/52.1

(56) References Cited

U.S. PATENT DOCUMENTS 6,696,901 B1 * 2/2004 Takeda et al. ............... 333/1.1
2003/0080820 A1 * 5/2003 Nozu et al. .................. 333/1.1

FOREIGN PATENT DOCUMENTS

JP 2001-332908 11/2001

* cited by examiner

*Primary Examiner*—Hung V. Ngo
(74) *Attorney, Agent, or Firm*—Brinks Hofer Gilson & Lione

(57) ABSTRACT

A non-reversible circuit device includes input-output terminals formed on one end side of first, second, and third central conductors, respectively. The other ends thereof are introduced to one surface of a laminated substrate to form ground terminals. A ferrimagnetic member has electrode portions and is disposed on the one surface of the laminated substrate, so that the ground terminals are connected to the electrode portions. Thus, the ground terminals of the central conductors can be positioned so as not to project from the ferrimagnetic member. Thus, the laminated substrate can be reduced in size.

8 Claims, 3 Drawing Sheets

NON-REVERSIBLE CIRCUIT DEVICE HAVING LAMINATED SUBSTRATE CAPABLE OF BEING REDUCED IN SIZE

BACKGROUND OF THE INVENTION

1. Field of the Invention

The present invention relates to a non-reversible circuit device such as a circulator and an isolator for use as a high frequency device which operates in a microwave band.

2. Description of the Related Art

The configuration of a prior art non-reversible circuit device will be described with reference to FIG. 4. The device contains a disk-shaped ferrimagnetic plate 51.

A laminated substrate 52 is formed by laminating a plurality of insulation layers. A concavity 52*a* is formed in the center of the substrate 52.

First, second, and third central conductors 53, 54, and 55 comprising electroconductive plates of copper or the like are arranged at 120 degree intervals and have different heights in the vertical direction of the laminated substrate 52. The central conductors 53, 54, and 55 are electrically insulated from each other, and are arranged in such a manner that a part of the respective central conductors cross each other in the vertical direction of the laminated substrate.

One-side ends of the first, second, third central conductors 53, 54, and 55 are introduced to one surface (upper surface) 52*b* of the laminated substrate 52 via connecting conductors 56*a,* 56*b,* and 56*c* placed in through-holes (not shown) formed in the laminated substrate 52, and form input-output terminals 53*a,* 54*a,* and 55*a,* respectively.

Moreover, the other-side ends of the first, second, and third central conductors 53, 54, and 55 are introduced to the one surface (upper surface) 52*b* of the laminated substrate 52 via connecting conductors 57*a,* 57*b,* and 57*c* placed in through-holes (not shown) formed in the laminated substrate 52, and form input-output terminals 53*b,* 54*b,* and 55*b* respectively.

The ferrimagnetic member 51 is disposed in the concavity 51*a* of the laminated substrate 52. In this state, a DC magnetic field is applied to the ferrimagnetic member 51 by means of a magnet (not shown) disposed in the neighborhood of the part of the device where the first, second, and third central conductors 53, 54, and 55 cross each other. Thus, inputting and outputting is carried out through the input-output terminals 53*b,* 54*b,* and 55*b.*

The ferrimagnetic member 51, the laminated substrate 52, and the magnet (not shown) are covered with a yoke (not shown in FIG. 4) to form a non-reversible circuit device. The non-reversible circuit device is mounted onto a circuit substrate. Moreover, capacitors mounted on the circuit substrate are connected to the input-output terminals 53*a,* 54*a,* and 55*a* of the first, second, and third central conductors 53, 54, and 55 via a wiring pattern.

In the case of the prior art non-reversible circuit device, the connecting conductors 57*a,* 57*b,* and 57*c* used to form the ground terminals 53*b,* 54*b,* and 55*b* are disposed at the positions in the device which are radially projected from the ferrimagnetic member 51. This causes a problem in that the size of the laminated substrate 52 is increased in the radial direction.

Moreover, since the capacitors are mounted on the laminated substrate 52, the space factor of the non-reversible circuit device is inferior, so that the size of the device is increased.

SUMMARY OF THE INVENTION

Accordingly, it is an object of the present invention to provide a compact non-reversible circuit device having a laminated substrate reduced in size.

According to the present invention, there is provided A non-reversible circuit device which comprises a ferrimagnetic member, and first, second, and third central conductors arranged on and/or in a laminated substrate at different heights in the vertical direction of the laminated substrate, wherein a part of the respective central conductors cross each other in the vertical direction of the laminated substrate, one ends of the respective first, second, and third central conductors constitute input-output terminals, and the other ends thereof are introduced to one surface of the laminated substrate to constitute ground terminals, and the ferrimagnetic member has electrode portions and is arranged on the one surface of the laminated substrate so that the ground terminals are connected to the electrode portions, respectively. Accordingly, the ground terminals of the central conductors can be positioned so as not to project from the ferrimagnetic member. Thus, the laminated substrate can be reduced in size. A small-sized non-reversible circuit device can be provided.

Preferably, the electrode portions are formed on one surface of the ferrimagnetic member opposed to the laminated substrate. Thus, the ground terminals can be easily connected to the electrode portions. The production efficiency is enhanced.

The ferrimagnetic member preferably has a side electrode portion formed on the side-surface of thereof so as to be connected to the electrode portions. Therefore, the electrode portions can be easily connected to the second yoke via the side electrode portion. Work for the connection can be easily performed.

Also, the ferrimagnetic member has a lower electrode portion formed on the other surface thereof so as to be connected to the side electrode portion. Therefore, the lower electrode potion can be securely connected to the second yoke, and the ground terminals can be securely grounded.

Preferably, the input-output terminals are formed on the one surface of the laminated substrate, respectively. Accordingly, the input-output terminals can be provided on the same surface of the laminated substrate. The wiring workability is enhanced.

Also, the input-output terminals preferably are formed so as to extend onto the side surface of the laminated substrate. Therefore, wiring can be carried out on the side surface of the laminated substrate, not projecting from the upper surface of the laminated substrate. A thin non-reversible circuit device can be provided.

Preferably, the device further comprises chip-type capacitors which are disposed on the one surface of the laminated substrate, and one-side electrodes of the capacitors are connected to the input-output terminals, respectively. Therefore, wiring for the capacitors can be easily performed. Thus, a small-sized, compact non-reversible circuit device can be provided.

Preferably, the non-reversible circuit device further comprises a first yoke accommodating a magnet and a second yoke accommodating the ferrimagnetic member and the capacitors, the first yoke being joined to the second yoke with the magnet being disposed above the central conductors whereby the first and second yokes form a magnetic closed circuit, the electrode portion formed on the ferrimagnetic member being connected to the second yoke to be grounded, the other-side electrodes of the capacitors being connected to the second yoke to be grounded. Accordingly, the capacitors can be compactly arranged. Thus, a small-sized, compact non-reversible circuit device, compared to a prior art one, can be provided.

DESCRIPTION OF THE PREFERRED EMBODIMENTS

Figure 1:
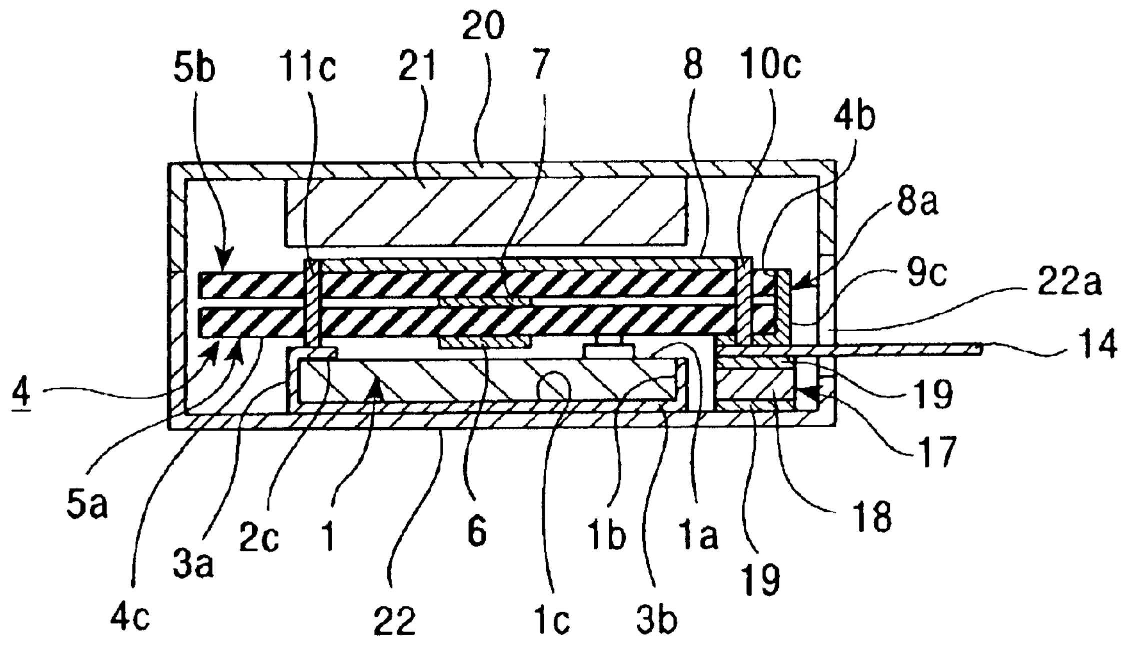
FIG. 1 is a cross-sectional view of the essential part of a non-reversible circuit device according to an embodiment of the present invention.
Figure 2:
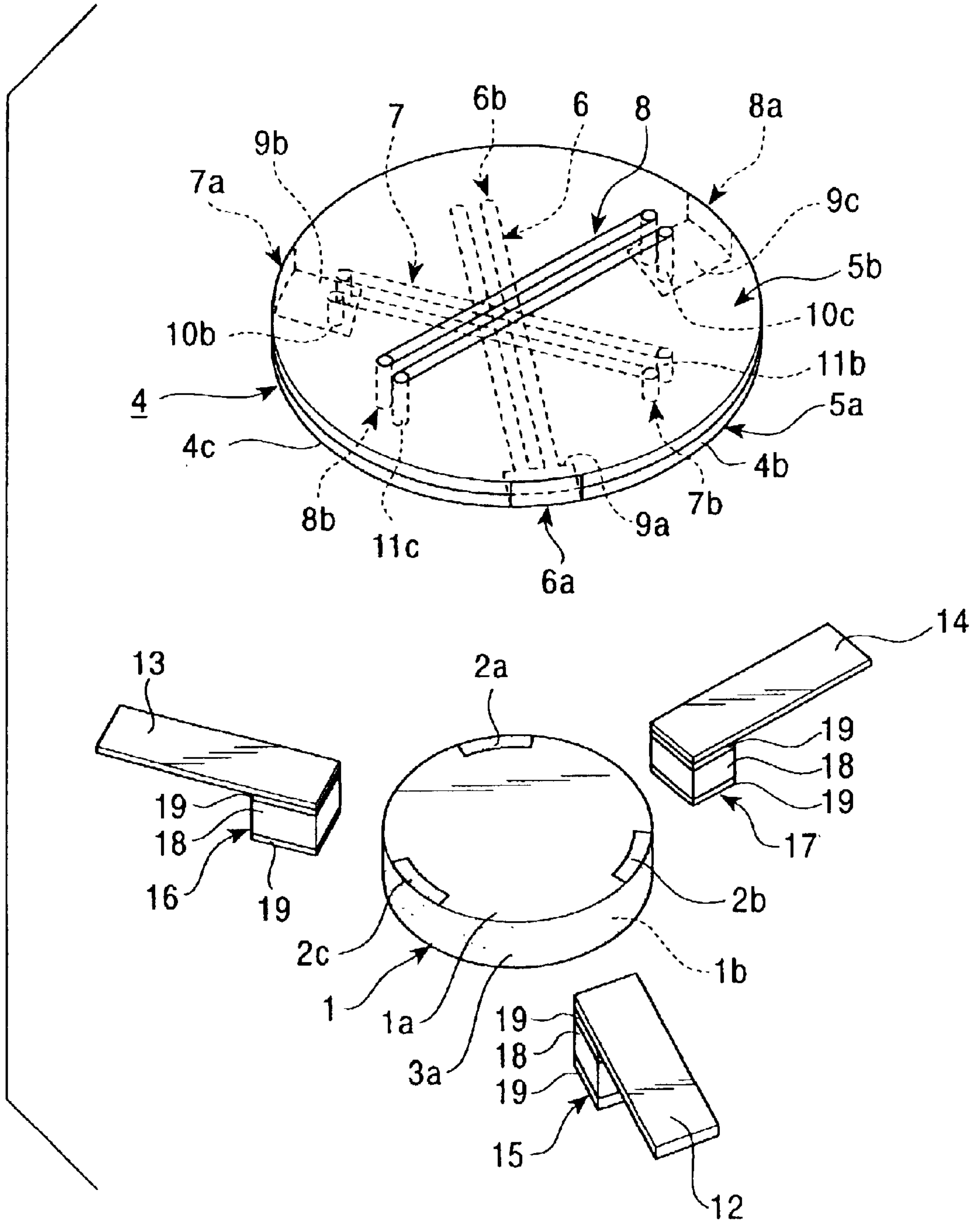
FIG. 2 is an exploded perspective view of the essential part of the non-reversible circuit device according to the embodiment of the present invention.
Figure 3:
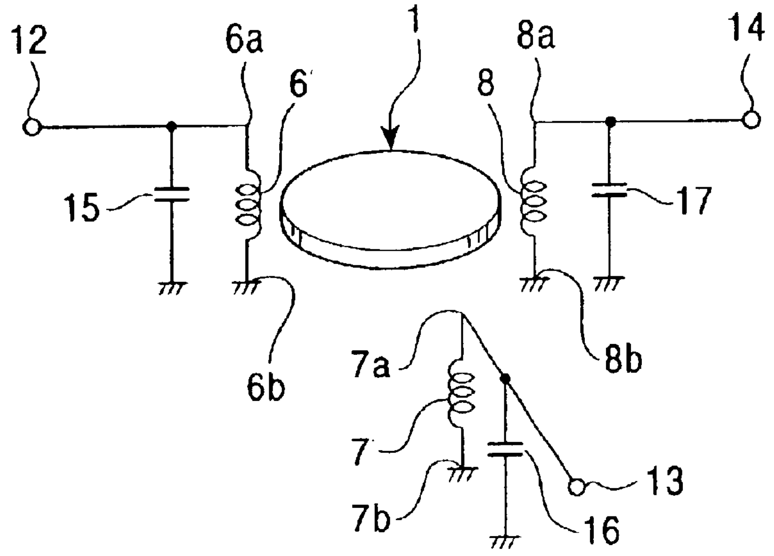
FIG. 3 is a circuit diagram of a circulator which is relevant to the non-reversible circuit device of the present invention.
Figure 4:
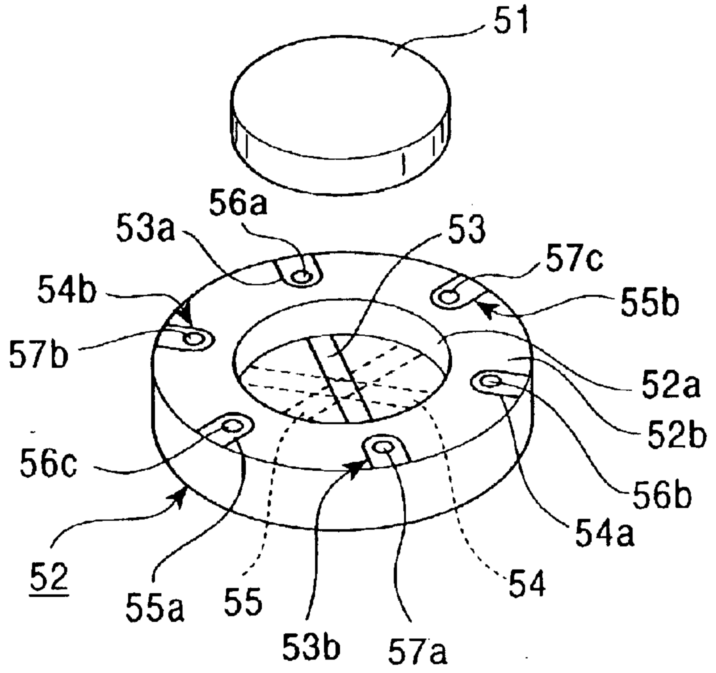
FIG. 4 PRIOR ART
FIG. 4 is an exploded perspective view of a prior art non-reversible circuit device.

Hereinafter, the non-reversible circuit device of the present invention will be described with reference to the drawings. FIG. 1 is a cross-sectional view of the essential part of a non-reversible circuit device according to an embodiment of the present invention. FIG. 2 is an exploded perspective view of the essential part of the non-reversible circuit device according to the present invention. FIG. 3 is a circuit diagram of a circulator which is relevant to the non-reversible circuit device according to the present invention.

The non-reversible circuit device according to the present invention will be described with reference to FIGS. 1 and 2. The non-reversible circuit device contains a disk-shaped ferrimagnetic member 1.

At least two electrode portions 2*a,* 2*b,* and 2*c* (in this case, three electrode portions) are formed on the upper surface 1*a* of the ferrimagnetic member 1. A side electrode portion 3*a* is formed on the side surface 1*b* so as to be connected to the electrode portions 2*a,* 2*b,* and 2*c.* Moreover, a lower electrode portion 3*b* is formed on the lower surface 1*c* so as to be connected to the side electrode portion 3*a.*

The electrode portions 2*a,* 2*b,* and 2*c,* the side electrode portion 3*a,* and the lower electrode portion 3*b* are made of an alloy containing cobalt, nickel, or tin or the like which can be soldered, and are formed by plating.

At least two electrode portions 2*a,* 2*b,* and 2*c* (in this case, three electrode portions) are formed as described above. However, one ring-shaped electrode may be formed instead of these electrode portions.

A disk-shaped laminated substrate 4 is formed by laminating at least two insulation layers 5*a* and 5*b.*

First, second, and third conductors made of electroconductive plates of copper or the like each having a two-forked or two-stripe shape are arranged at 120 degree intervals. These first, second, and third central conductors 6, 7, and 8 are arranged so as to have different heights in the vertical direction of the laminated substrate 4, and are electrically insulated from each other.

In particular, the first central conductor 6 is disposed on the lower surface of the insulation layer 5*a* which is positioned on the lower side of the laminated substrate 4. The second central conductor 7 is disposed on the upper surface of the insulation layer 5*a* so as to be sandwiched between the insulation layers 5*a* and 5*b* which is positioned on the upper side of the layer 5*a.* Moreover, the third central conductor 8 is disposed on the upper surface of the insulation layer 5*b.* Thus, the first, second, and third central conductors 6, 7, and 8 are insulated from each other by means of the insulation layers 5*a* and 5*b,* respectively.

The first, second, and third central conductors 6, 7, and 8 are arranged in such a manner that a part of the respective central conductors cross each other in the vertical direction of the laminated substrate.

In the above-description, the laminated substrate 4 comprises the two insulation layers 5*a* and 5*b.* However, three insulation layers may be used. In this case, the central conductors are formed on one-side surfaces of the insulation layers.

Conductive members 9*a,* 9*b,* and 9*c* made of a conductive material are provided on the lower surface 4*c* of the laminated substrate 4. The conductive members 9*a,* 9*b,* and 9*c* are formed so as to be extended onto the side surface 4*b* of the laminated substrate 4.

One end of the first central conductor 6 is connected directly to the conductive member 9*a.* One ends of the second and third central conductors 7 and 8 are connected to the conductive members 9*b* and 9*c* via connecting conductors 10*b* and 10*c* placed in through-holes (not shown) provided in the laminated substrate 4, respectively.

As a result, the conductive members 9*a,* 9*b,* and 9*c* constitute input-output terminals 6*a,* 7*a,* and 8*a* on the one-end sides of the central conductors 6, 7, and 8, respectively.

Moreover, the other ends of the second and third central conductors 7 and 8 are introduced to the lower surface 4*c* of the laminated substrate 4 via connecting conductors 11*b* and 11*c* placed in through-holes (not shown) formed in the laminated substrate 4, respectively. The other end of the first central conductor 6 is exposed on the lower surface 4*c.* Thus, the introduced other ends of the first, second, and third central conductors 6, 7, and 8, which position at the lower surface of the laminated substrate 4, forms ground terminal 6*b,* 7*b,* and 8*b,* respectively.

The lower surface 4*c* of the laminated substrate 4 is mounted onto the upper surface 1*a* of the ferrimagnetic member 1. Thus, the ground terminals 6*b,* 7*b,* and 8*b* are positioned on the electrode portions 2*a,* 2*b,* and 2*c,* respectively. The electrode portions 2*a,* 2*b,* and 2*c* and the ground terminals 6*b,* 7*b,* and 8*b* are soldered to each other for connection, respectively.

Chip capacitors 15, 16, and 17 each comprise a dielectric 18 made of an insulator and electrodes 19 formed on the upper and lower surfaces of the dielectric 18.

Input-output terminals 12, 13, and 14 are connected to the electrodes 19 positioned on the upper surfaces of the capacitors 15, 16, and 17, respectively.

The capacitors 15, 16, and 17 are arranged on the lower surface 4*c* side of the laminated substrate 4. Thus, the one electrodes 19 are connected to the input-output terminals 6*a,* 7*a,* and 8*a* of the first, second, and third central conductors 6, 7, and 8, respectively.

A disk-shaped magnet 21 is accommodated in a cup-shaped first yoke 20 made of a magnetic material. The first yoke 20 is disposed over the laminated substrate 4 with the magnet 21 being placed above the third central conductor 8.

A cup-shaped second yoke 22 made of a magnetic material has at least two slits 22*a* formed in the side portion thereof. The second yoke 22 accommodates the ferrimagnetic member 1, the laminated substrate 4, and the capacitors 15, 16, and 17, and is bonded to the first yoke 20.

The first and second yokes 20 and 22 form a magnetic closed circuit. The lower electrode portion 3*b* formed on the ferrimagnetic member 1 is connected to the second yoke 22 to be grounded. As a result, the ground terminals 6*b,* 7*b,* and 8*b* of the first, second, and third central conductors 6, 7, and 8 are grounded. Moreover, the other electrodes 19 of the capacitors 15, 16, and 17 are connected to the second yoke 22 to be grounded.

In this case, the input-output terminals 12, 13, and 14 are projected outward through the slits 22*a,* respectively.

Thus, the non-reversible circuit device having the above-described configuration is formed. FIG. 3 shows a circuit diagram of a circulator which is one type non-reversible circuit device. The first, second, and third central conductors 6, 7, and 8 are provided with the input-output terminals 6*a,* 7*a,* and 8*a* on the one-end sides thereof, and also, with the ground terminals 6*b,* 7*b,* and 8*b* on the other-end sides, respectively. The lower electrode portion 3*b* is connected to the second yoke 22, so that the ground terminals 6*b,* 7*b,* and 8*b* are grounded.

The input-output terminals 12, 13, and 14 are connected to the input-output terminals 6*a,* 7*a,* and 8*a,* respectively. The grounded capacitors 15, 16, and 17 are connected between the first, second, and third central conductors 15, 16, and 17 and the input-output terminals 12, 13, and 14, respectively. The magnet 21 disposed in the neighborhood of the location where the central conductors cross each other applies a DC magnetic field to the ferrimagnetic plate 1. Inputting and outputting are carried out through the input-output terminals 12, 13, and 14.

In the above-described embodiment, the laminated substrate has a disk-shape. The substrate may be polygonal. Moreover, the described laminated substrate has a diameter significantly larger than that of the ferrimagnetic member. A laminated substrate having a diameter equal to or slightly larger than that of the ferrimagnetic member may be employed.

The central conductors each having a two-stripe shape have been described. Central conductors each having a one-belt shape may be used.

What is claimed is:

1. A non-reversible circuit device comprising a ferrimagnetic member, and first, second, and third central conductors arranged one of on and in a laminated substrate at different heights in a vertical direction of the laminated substrate, wherein a part of the respective central conductors cross each other in the vertical direction of the laminated substrate, one ends of each of the respective first, second, and third central conductors constitute input-output terminals, and the other ends thereof are introduced to one surface of the laminated substrate to constitute ground terminals, and the ferrimagnetic member has electrode portions that are connected to one another, and is arranged on the one surface of the laminated substrate so that the ground terminals are connected to the electrode portions, respectively.

2. The non-reversible circuit device according to claim 1, wherein the electrode portions are formed on one surface of the ferrimagnetic member opposed to the laminated substrate.

3. The non-reversible circuit device according to claim 2, wherein the ferrimagnetic member has a side electrode portion formed on a side-surface of thereof so as to be connected to the electrode portions.

4. The non-reversible circuit device according to claim 3, wherein the ferrimagnetic member has a lower electrode portion formed on the other surface thereof so as to be connected to the side electrode portion.

5. The non-reversible circuit device according to claim 1, wherein the input-output terminals are formed on the one surface of the laminated substrate.

6. The non-reversible circuit device according to claim 5, wherein the input-output terminals are formed so as to be extended onto a side surface of the laminated substrate.

7. The non-reversible circuit device according to claim 5, further comprising chip-type capacitors disposed on the one surface of the laminated substrate, and one-side electrodes of the capacitors are connected to the input-output terminals, respectively.

8. The non-reversible circuit device according to claim 7, further comprising a first yoke accommodating a magnet and a second yoke accommodating the ferrimagnetic member and the capacitors, the first yoke being joined to the second yoke with the magnet being disposed above the central conductors whereby the first and second yokes form a magnetic closed circuit, the electrode portions formed on the ferrimagnetic member being connected to the second yoke to be grounded, other-side electrodes of the capacitors being connected to the second yoke to be grounded.

* * * * *